Jan. 8, 1952 C. J. NORTON 2,581,968

DISCRIMINATOR CIRCUIT

Filed Aug. 8, 1947

INVENTOR.
Clyde J. Norton
BY

ATTORNEY

Patented Jan. 8, 1952 2,581,968

UNITED STATES PATENT OFFICE 2,581,968

DISCRIMINATOR CIRCUIT

Clyde J. Norton, Braintree, Mass., assignor to Sylvania Electric Products Inc., Salem, Mass., a corporation of Massachusetts Application August 8, 1947, Serial No. 767,588

2 Claims. (Cl. 250—27)

This invention relates to electric control circuits of the discriminator type for developing a control potential proportional to the deviation of an input signal from a desired frequency.

The circuit of the invention is arranged to receive a radio frequency signal which is fed to a network of impedance and capacitance units having predetermined characteristics. The network includes two parallel circuits through which the input signal passes. A connection is made from between the elements of each parallel circuit to a pair of diode tubes connected for rectification at opposite polarities. The diode outputs are fed to a mixer circuit from where the developed control signal is fed to a utilization circuit.

In one of the parallel circuits, signals above the desired frequency develop a certain potential at the connection between its elements when the frequency is higher than desired while at the connection between elements of the other parallel circuit a lower potential is developed. These two radio frequency potentials when rectified by the diode tubes and passed through a mixer means appear as a controlling voltage of polarity and magnitude determined by the deviation of the frequency of the input signal from the desired frequency. This control voltage is used through a frequency changing device to correct any deviation from the desired frequency which appears at the input.

It is an object of the invention to provide a discriminator circuit which is highly efficient and accurate in operation.

A further object of the invention is to provide a discriminator circuit adapted to accept and correct a signal which varies a substantial amount from the desired output frequency of a utilization circuit.

A further object of the invention is to provide a discriminator circuit composed of a minimum of elements which are extremely stable in operation.

A further object of the invention is to provide a discriminator circuit which requires a minimum of power input energy for its operation.

To provide a better understanding of the invention a particular embodiment thereof will be described and illustrated in the accompanying drawings in which.

The invention may be utilized in many different ways. For example, it may be applied to a superheterodyne receiver as shown in block diagram in Figure 2. The invention relates to the discriminator of the radio receiver which takes a portion of the input signal from the intermediate frequency amplifier, performs its corrective function and passes a correcting signal to a controlling element which in turn conducts a signal to a local oscillator from where a corrected frequency component goes to the first detector mixer. From here a corrected signal is transmitted to the intermediate amplifier, the second detector and thence to the audio system of the receiver.

Figure 1:
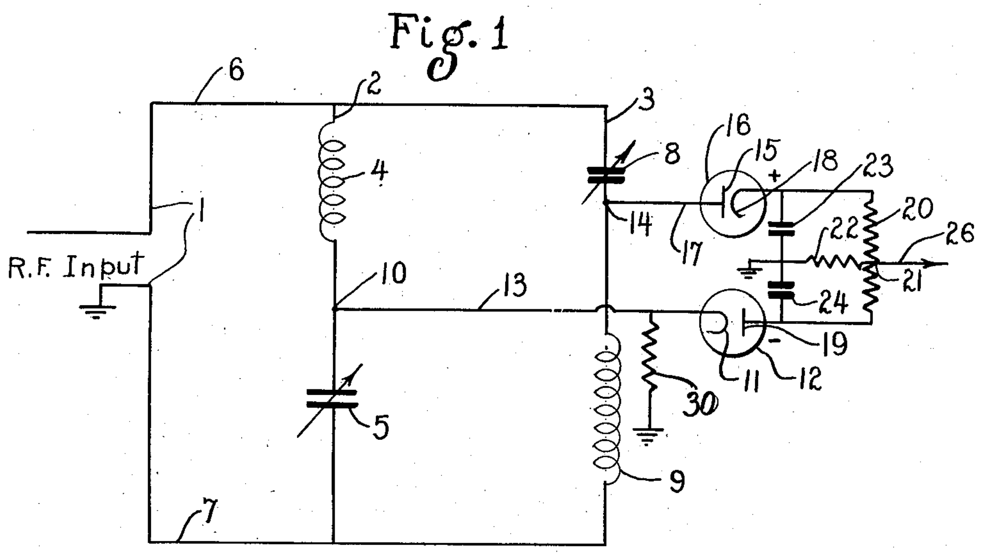
Figure 1 is a diagrammatic view of a circuit embodying the invention.
Figure 2:
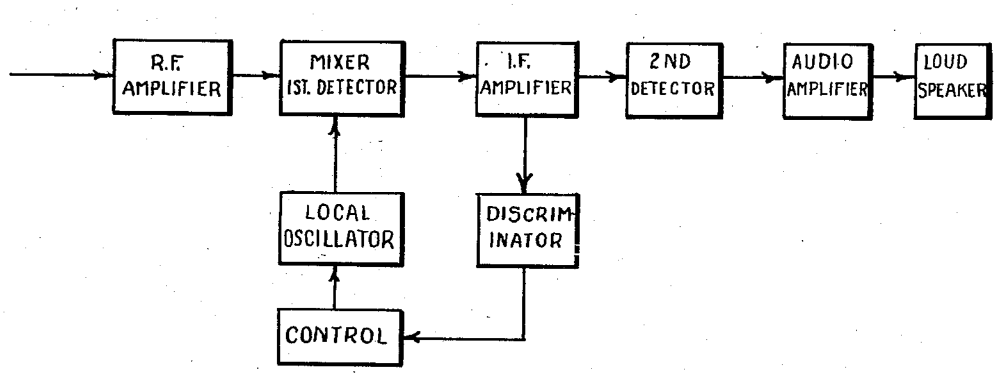
Figure 2 is a block diagram illustrating one application of the invention.

As indicated the invention resides in the discriminator circuit which is shown diagrammatically in Figure 2. A radio frequency signal is fed to the input circuit 1 from where the signal passes through a pair of parallel circuits 2 and 3. The circuit 2 is composed of an inductance 4 and capacitance 5 connected in series therein between the parallel conductors 6 and 7. The circuit 3 is composed of the capacitance 8 and the inductance 9. It should be noted that the inductance and capacitances in the circuits 2 and 3 are connected respectively in reverse order with respect to conductor 7, which is at ground potential.

A connection 10 is made between the elements of circuit 2 and connected to the cathode 11 of a diode tube 12 through a conductor 13. Another connection 14 is made from between the elements 8 and 9 to the plate 15 of another diode tube 16 through a conductor 17.

The cathode 18 of the diode 16 and the plate 19 of the diode 12 are connected to a mixer network comprising a resistor 20 to the ends of which the cathode 18 and the plate 19 are connected. A center tap 21 on the resistor 20 is connected to ground through a suitable resistor 22. The cathode 18 and the plate 19 have connected thereto respectively condensers 23 and 24 which are in turn connected to ground. Thus any alternating current appearing at the diode output terminals will be passed to ground. An output conductor 26 is connected to the center tap 21 on the resistor 20.

A resistor 30 is shown between cathode 11 and ground for furnishing a direct-current return path to the grounded input terminal to which the input signal is applied. Cathode 15, it will be understood, has a direct current return circuit to this grounded input terminal through inductive element 9.

In operation a radio frequency signal is impressed upon the input connections 1 which are conducted to the two parallel circuits 2 and 3. The circuits 2 and 3 are both tuned to resonance at the frequency to which a utilization circuit functions. In the application described herein the frequency would be that of the intermediate frequency amplifier. If the input signal has a frequency equal to the desired frequency, then since the two circuits 2 and 3 are in resonance to that frequency and since the impedance of both circuits is the same at the required frequency equal potentials appear at points 10 and 14 and therefore equal potentials appear at the plate 15 and the cathode 11 of the diodes 16 and 12. Since the outputs of the diodes are opposite in polarity and equal in potential the resulting potential at the center tap of the mixer unit is zero. No potential therefore passes along through the output lead and no correction takes place.

If, however, the input frequency is higher than the desired frequency the impedance of the inductance 4 in circuit 2 becomes higher thus reducing the potential at the connection 10 and therefore at the cathode 11. At this same relatively higher frequency the signal in passing through the circuit 3 meets a relatively lower impedance in the condenser 8 thus a potential appears at point 14 and at the plate 15 which is higher than the potential of the point 10. All of the potentials above mentioned are measured with respect to the potential of the conductor 7 connected to ground. The difference in potential at the diodes is in proportion to the degree of difference between the input signal and the desired frequency. The output of the diodes now creates an unbalanced condition at the center tap of the mixer resistor 20. Thus a plus or minus voltage appears in the output lead 23. This voltage is of a polarity and value in proportion to the frequency correction required.

This correction potential then passes to the control device and thence to the local oscillator which corrects the input signal at the first detector and mixer unit.

The above result takes place when a signal is received having a frequency higher than desired. If a signal of lower frequency is received, the impedance of the inductance 4 thereto will be relatively lower than to a signal of the desired frequency. Therefore the potential of the point 10 will be relatively higher. On the other hand the impedance of the condenser 8 now becomes greater with a consequent drop in potential at the point 14. It follows therefore that a correction potential now appears in the conductor 23 having a polarity opposite to that which appeared in the case above described the signal also having a potential in proportion to the correction required.

It will be seen from the above that the condenser 5 in circuit 2 and the inductance 9 in function respectively in connection with the inductance 4 and condenser 8 to tune the circuits to the desired frequency. By making the capacitors 5 and 8 variable the two circuits 2 and 3 are readily tuned to the desired frequency. Moreover if it is desired to change the desired corrected frequency this may be done by adjusting the condensers to resonance at the new frequency.

An important feature of the present invention lies in its ability to correct an input signal which deviates a relatively great amount from the desired frequency. This has not been true of discriminators in use before the present invention.

Figure 3:
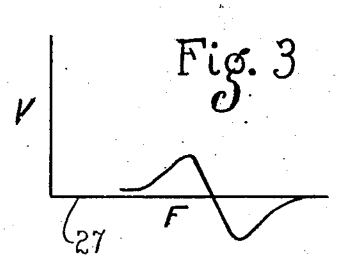
Figures 3 and 4 illustrate graphically the improved operation of the circuit of the invention.

Figure 3 is a curve representing the scope of acceptance of off-frequency signals in a conventional discriminator circuit. Vertical coordinates represent output voltage (that can be used for tuning correction in proper organizations) while horizontal coordinates represent frequency. The place where the curve crosses line 27 represents the desired or center frequency. The curve shows that very little frequency-correction voltage can be expected outside the immediate center of the discriminator characteristic.

Figure 4:
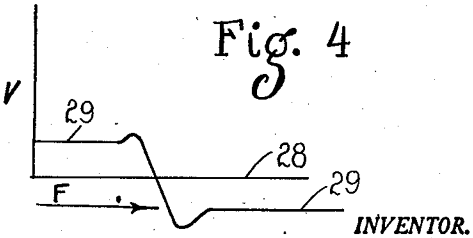

Figure 4 shows the frequency characteristic of the discriminator circuit embodying the invention. The place where the curve crosses line 28 represents the desired (center) frequency while the horizontal portions 29 of the curve illustrate the relatively large voltage available for frequency-correction outside the immediate center range where the output voltage is a linear function of frequency deviation.

What I claim is:

1. A discriminator circuit comprising two inductive elements and two capacitive elements connected in alternation in a loop, an opposite pair of connections in said loop constituting input terminals and the remaining pair of connections constituting output terminals of said loop, said elements being proportioned to yield equal voltage between either output terminal and one of the input terminals at a desired frequency, a diode having its anode connected to one of said output terminals, a second diode having its cathode connected to the other output terminal, a pair of condensers connected in series to the remaining electrodes of said diodes, the junction of said condensers being connected to said one input terminal, a pair of equal resistors also connected between said remaining electrodes of said diodes, and a load resistor between the junction of said equal resistors and said condensers, a discriminator output being available across said load resistor.

2. A discriminator circuit comprising two inductive elements and two capacitive elements connected in alternation in a loop, an opposite pair of connections in said loop constituting input terminals and the remaining pair of connections constituting output terminals of said loop, said elements being proportioned to yield equal voltage between either output terminal and one of the input terminals at a desired frequency, a diode having its anode connected to one of said output terminals, a second diode having its cathode connected to the other output terminal, a pair of condensers connected in series to the remaining electrodes of said diodes, the junction of said condensers being connected to one of said input terminals, a pair of equal resistors also connected between said remaining electrodes of said diodes, a load resistor between the junction of said equal resistors and said condensers, a discriminator output being available across said load resistor, one of said diodes having a direct current path through one of said inductive elements in said loop, to said one input terminal, and a resistor between said one input terminal and the connection of the other diode to the loop for providing a direct current path.

CLYDE J. NORTON.

REFERENCES CITED

The following references are of record in the file of this patent:

UNITED STATES PATENTS

| Number | Name | Date |
|---|---|---|
| 2,151,127 | Logan et al. | Mar. 21, 1939 |
| 2,190,319 | Koch | Feb. 13, 1940 |
| 2,404,026 | Beard | July 16, 1946 |
| 2,407,140 | Coake | Sept. 3, 1946 |
| 2,413,913 | Duke | Jan. 7, 1947 |